United States Patent
Hsu et al.

(10) Patent No.: US 7,684,178 B2
(45) Date of Patent: Mar. 23, 2010

(54) HOUSING FOR ELECTRONIC DEVICES, ELECTRONIC DEVICE USING THE HOUSING AND METHOD FOR MAKING THE HOUSING

(75) Inventors: Che-Yuan Hsu, Taipei Hsien (TW); Risto-Pekka Salmio, Jarvenpaa (FI); Cheng-Wen Su, Taipei Hsien (TW); Gang Huang, Shenzhen (CN); Yan-Min Wang, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 67 days.

(21) Appl. No.: 11/959,164

(22) Filed: Dec. 18, 2007

(65) Prior Publication Data
US 2009/0009942 A1    Jan. 8, 2009

(30) Foreign Application Priority Data
Jul. 4, 2007    (CN)    ......................... 2007 1 0076374
Jul. 4, 2007    (CN)    ......................... 2007 1 0076377

(51) Int. Cl.
*G06F 1/16*    (2006.01)
(52) U.S. Cl. .............................. 361/679.21; 455/575.8; 428/167
(58) Field of Classification Search .............. 455/575.8, 455/90.3; 428/122, 192, 167; 52/208, 393; 361/679.01–679.02, 679.34, 679.56
See application file for complete search history.

(56) References Cited

U.S. PATENT DOCUMENTS

| | | | |
|---|---|---|---|
| 7,495,895 B2 * | 2/2009 | Carnevali | 455/575.8 |
| 2008/0227507 A1 * | 9/2008 | Joo | 455/575.8 |

* cited by examiner

*Primary Examiner*—Hung V Duong
(74) *Attorney, Agent, or Firm*—Steven M. Reiss

(57) ABSTRACT

A housing (100) includes a decorative film (10) and a supporting frame (20). The decorative film has a surface being comprised of a decorative section (11) and a display section (12) capable of transmitting light. The decorative section has a decorative coating (110) coated thereon. The decorative coating defines the display section. The supporting frame is made of a transparent material and integrally molded onto the decorative film. An electronic device and method of making the housing are also provided.

18 Claims, 5 Drawing Sheets

HOUSING FOR ELECTRONIC DEVICES, ELECTRONIC DEVICE USING THE HOUSING AND METHOD FOR MAKING THE HOUSING

CROSS-REFERENCE TO RELATED APPLICATIONS

This application is related to a co-pending U.S. patent application Ser. No. 11/959,155, entitled "HOUSING FOR AN ELECTRONIC DEVICE, ELECTRONIC DEVICE USING THE HOUSING, AND METHOD FOR MAKING THE HOUSING", by Che-Yuan Hsu et al. This application is also related to another co-pending U.S. patent application Ser. No. 11/959,159, entitled "HOUSING FOR AN ELECTRONIC DEVICE AND METHOD FOR MAKING THE HOUSING", by Che-Yuan Hsu et al. Such applications have the same assignee as the present application and have been concurrently filed herewith. The above-identified applications are incorporated herein by reference. This application claims all benefits accruing under 35 U.S.C. §119 from China Patent Application No. 200710076374.1 filed on Jul. 4, 2007 and China Patent Application No. 200710076377.5 filed on Jul. 4, 2007 in the China Intellectual Property Office, the disclosures of which are incorporated herein by reference.

BACKGROUND OF THE INVENTION

1. Field of the Invention

The present invention generally relates to housings for electronic devices, and more particularly, to a housing for an electronic device having a display section, and method for making the housing injection molding process.

2. Discussion of the Related Art

Nowadays, electronic device such as mobile phone, have a variety of display units mounted therein so as to enable them to display information and/or graphics thereon.

A conventional housing for an electronic device includes a housing portion and a transparent view panel. A display unit is received in the housing portion. The view panel covers the display unit, so as to protect the display unit from being damaged. The housing portion and the view panel are, respectively, manufactured by two separate molding processes. The view panel is adhered to the housing portion using adhesive in order to prevent the view panel from separating from the housing portion. However, the method of adhering the view panel to the housing portion cannot achieve a desired level of airproof and dustproof performance. Thus, moisture and dust in the ambient air can enter into the electronic device, which causes damage to the electronic device. Furthermore, the housing portion and the view panel are manufactured by means of two separate processes, which prolongs the time needed to produce the electronic devices.

Therefore, an improved housing for electronic devices is desired in order to overcome the above-described shortcomings.

SUMMARY

In one embodiment thereof, a housing for an electronic device is provided. The housing includes a decorative film and a supporting frame. The decorative film has a surface comprises a decorative section and a display section capable of transmitting light. The decorative section has a decorative coating coated thereon. The decorative coating defines the display section. The supporting frame is made of a transparent material and integrally molded onto the decorative film.

Other advantages and novel features will become more apparent from the following detailed description of preferred embodiments when taken in conjunction with the accompanying drawings.

BRIEF DESCRIPTION OF THE DRAWINGS

Many aspects of the housing for an electronic device can be better understood with reference to the following drawing. The components in the drawing are not necessarily drawn to scale, the emphasis instead being placed upon clearly illustrating the principles of the housing for an electronic device. Moreover, in the drawing like reference numerals designate corresponding parts throughout the several views.

DETAILED DESCRIPTION OF THE PREFERRED EMBODIMENTS

Figure 1:
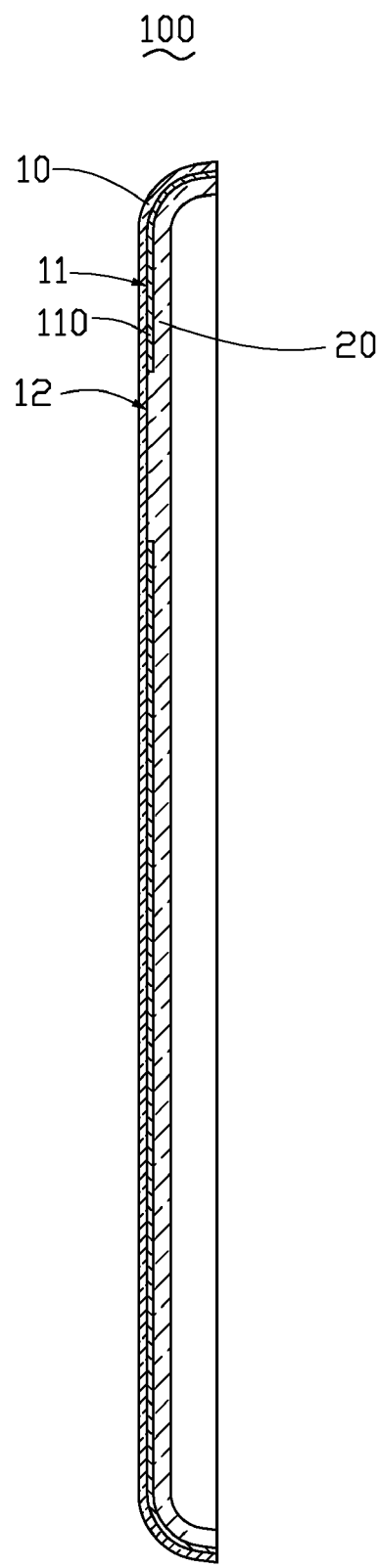
FIG. 1 is a cross-section view of a preferred embodiment of a housing for an electronic device.

Referring to FIG. 1, in a present embodiment, a housing 100 includes a decorative film 10 and a supporting frame 20.

The decorative film 10 can, advantageously, be made of polycarbonate. The decorative film 10 has a surface including a decorative section 11 and a display section 12. The decorative section 11 has a decorative coating 110 coated thereon to form a predetermined pattern. The decorative coating 110 can be an ink coating, a paint coating or a metal coating. The display section 12 is capable of transmitting light, as the display section 12 not being coated with the decorative coating 110. Thus, the decorative film 10 can transmit light through the display section 12. Understandably, the decorative film 10 can also be made of other clear plastic such as polymethyl methacrylate and polystyrene.

The supporting frame 20 is made of a transparent plastic material, advantageously chosen from the group of polycarbonate, polymethyl methacrylate, polystyrene, and any desired combination thereof. It should be understood that the supporting frame 20 could also be made of silica gel. The supporting frame 20 is attached to the decorative coating 110 and the display section 12 of the decorative film 10 using injection molding, with the decorative coating 110 placed between the decorative film 10 and the supporting frame 20.

Figure 2:
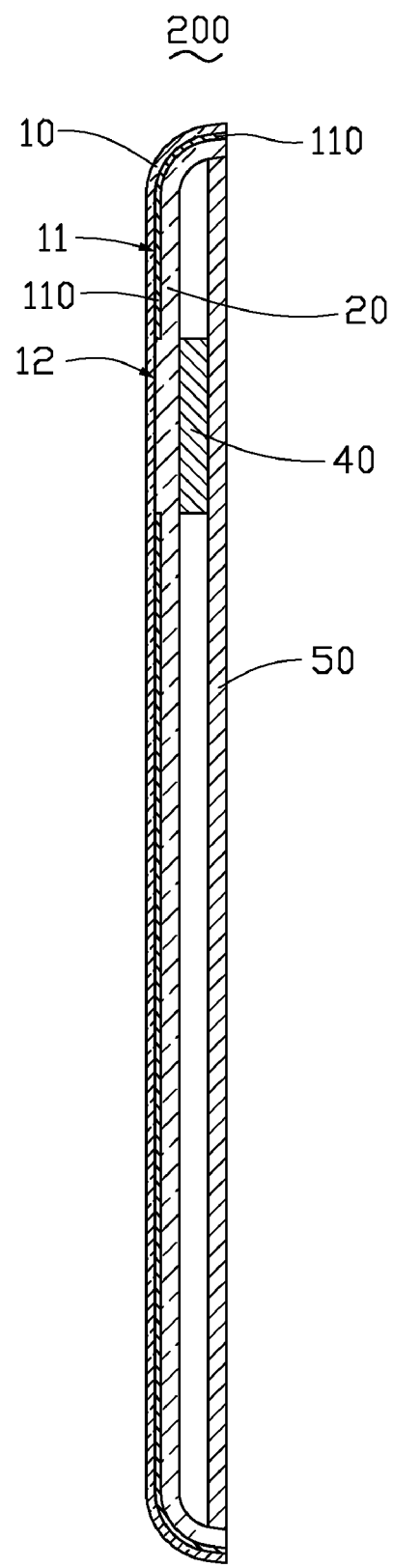
FIG. 2 is a cross-section view of a preferred embodiment of an electronic device using the housing shown in FIG. 1.

Referring to FIG. 2, the housing 100 can be used in an electronic device 200 (e.g., a mobile phone, digital camera, or PDA) with a display unit 40 and a printed circuit board 50 received therein. The display unit 40 is electrically connected to the printed circuit board 50 so as to display digital information, images, or graphs. The display unit 40 is aligned with the display section 12, in a manner of that light transmitted from the display unit 40 can transmit through the display section 12. Thus, one portion of the supporting frame 20 attached to the display section 12 can function as a view lens to protect the display unit and capable of transmitting light. The supporting frame 20 and the decorative film 10 can be fixed together without gap with a concordant seal. As such, the housing 100 used in the electronic device 200 can obtain a highly airtight, water-resistant, and dustproof seal.

An exemplary method for making the housing 100 is provided. Firstly, the decorative film 10 is provided. The decorative film 10 can, advantageously, be polycarbonate thin film. The decorative film 10 comprises the decorative section 11 and the display section 12. The decorative section 11 has a decorative coating 110 coated thereon to form a predetermined pattern. The decorative coating 110 is either an ink coating or a paint coating, which can be formed via brushing, spray painting, or screen printing. The decorative coating 110 can also be a metal coating, which is formed via physical vacuum deposition process. The display section 12 is capable of transmitting light, as the display section 12 not being coated with the decorative coating 110.

Figure 3:
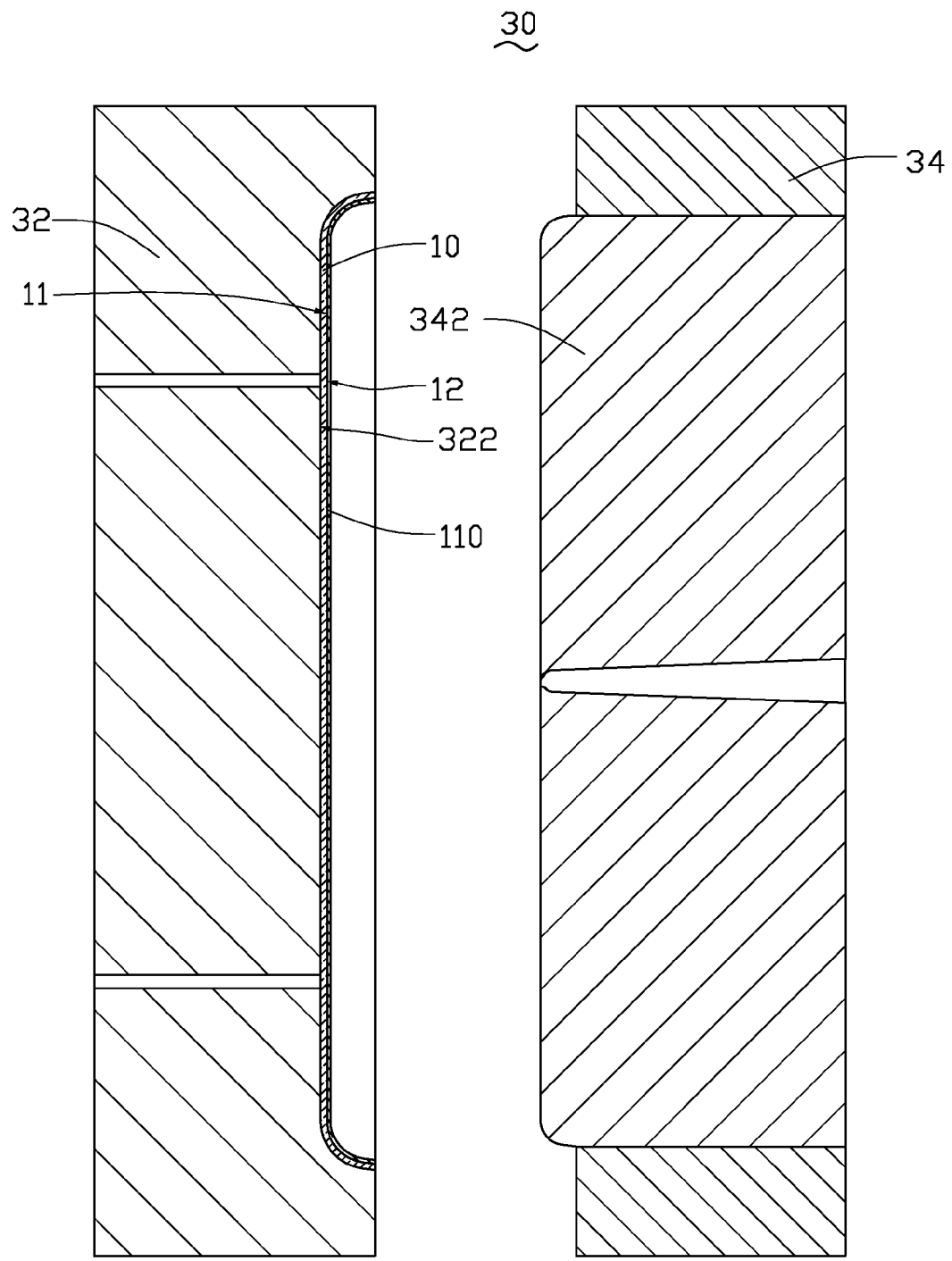
FIG. 3 is a schematic view of a mold for making the housing in FIG. 1.

Secondly, referring to FIG. 3, the decorative film 10 is fixed into a mold 30. The mold 30 includes a female mold 32 and a male mold 34 matingly engageable with the female mold 32. The female mold 32 has a recessed portion 322 formed therein. The male mold 34 has a movable mold core 342 mounted thereon. The decorative film 10 is attached into the recessed portion 322 of the female mold 32, with the decorative coating 110 facing the male mold 34.

Figure 4:
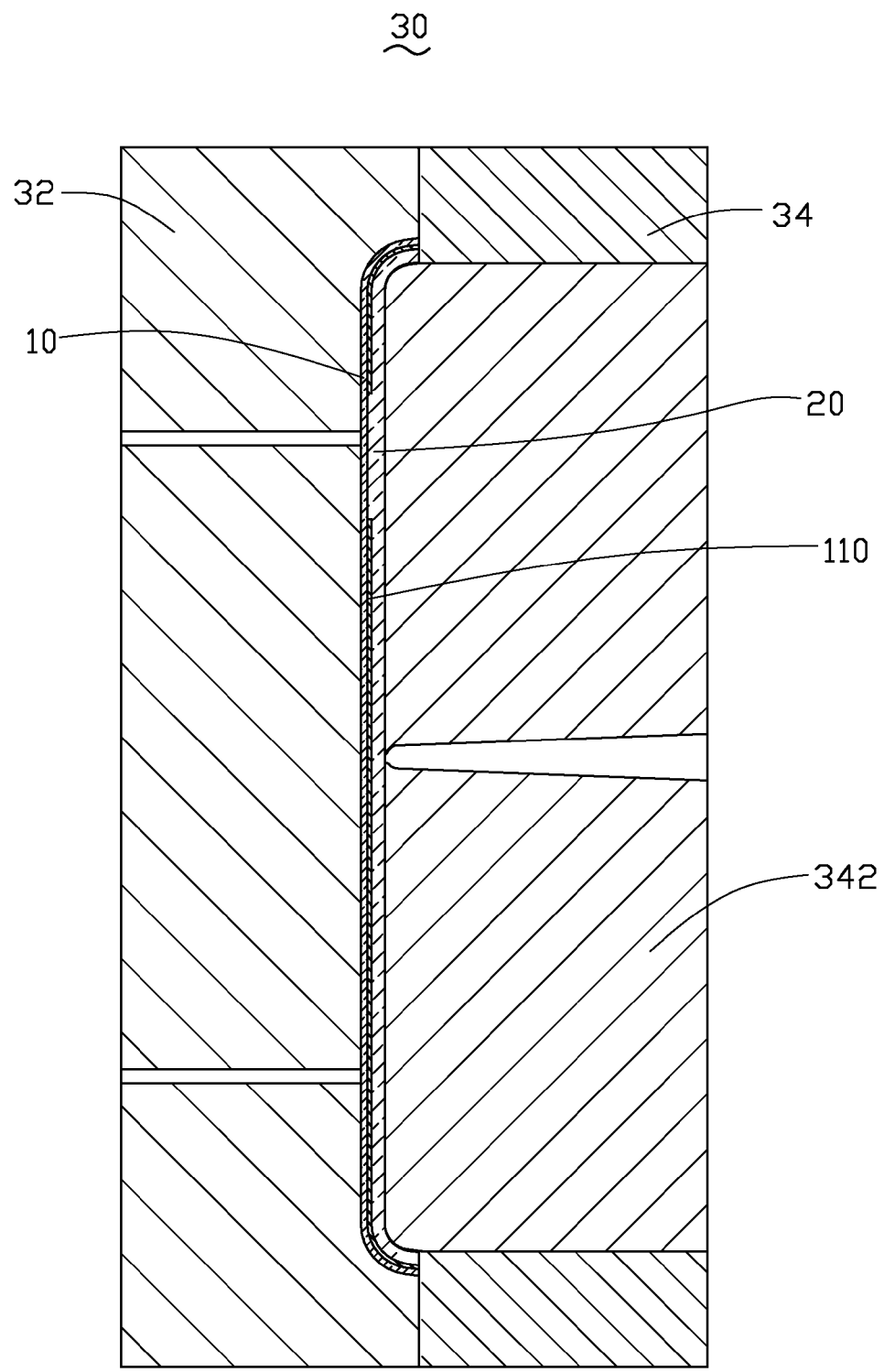
FIG. 4 is a schematic view of the mold in FIG. 3 at a close state.
Figure 5:
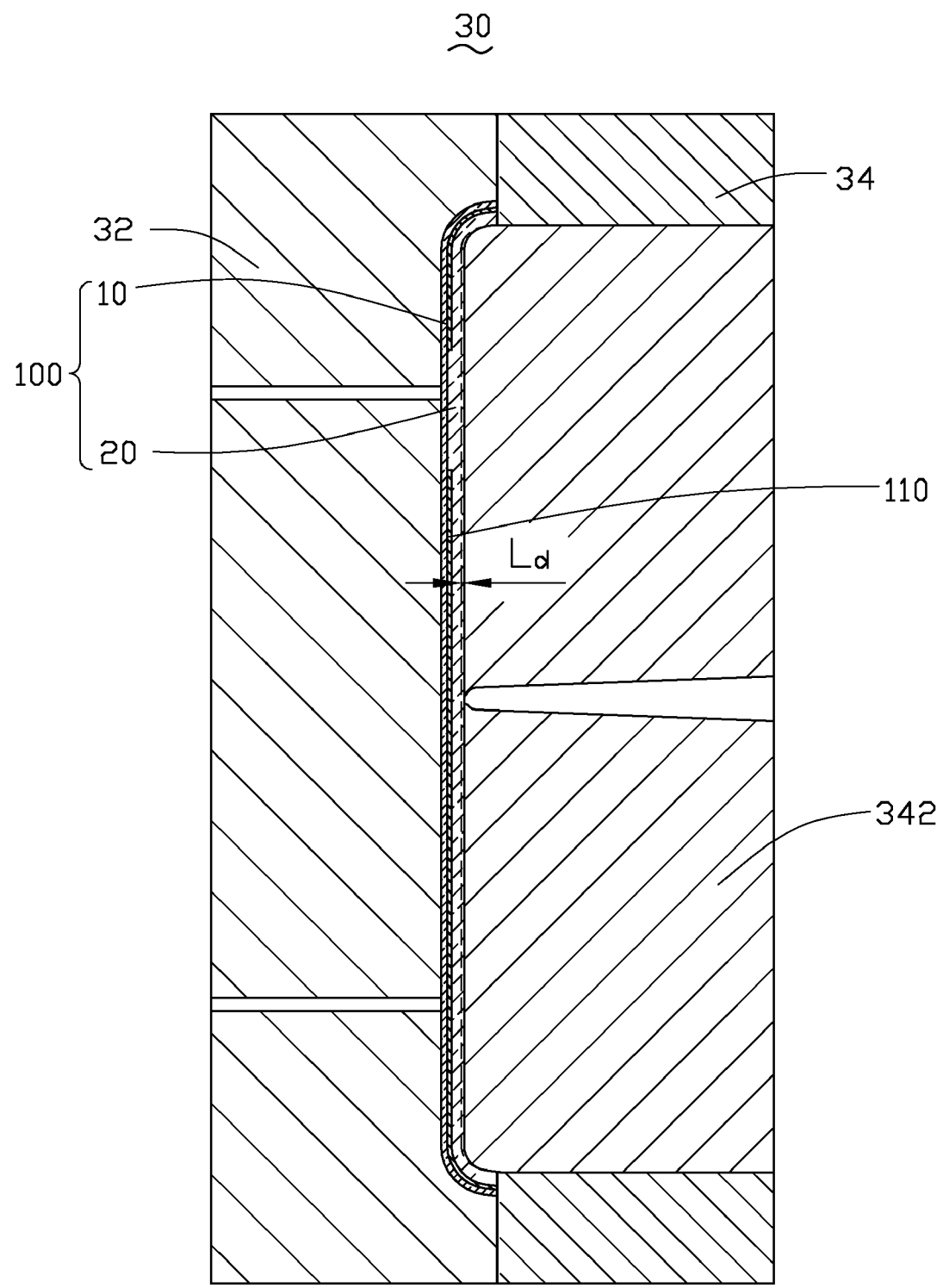
FIG. 5 is a schematic view of the mold in FIG. 3, with the housing molded therein.

Thirdly, the mold 30 is closed. Referring to FIG. 4, a molding cavity is defined between the recessed portion 322 of the female mold 32 and the mold core 342 of the male mold 34. Molten plastic or silica gel is injected into the molding cavity. The molten plastic could be transparent plastic material, advantageously chosen from the group of polycarbonate, polymethyl methacrylate, polystyrene, and any desired combination thereof. Thus, referring to FIG. 5, the supporting frame 20 is formed on the decorative film 10. As such, the housing 100 is formed in the mold 30.

Finally, the supporting frame 20 is compressed in the mold 30 with moving the movable mold core 342 toward the female mold 32. A compression stroke $L_d$ of the mold core 342 is in an approximate range from 0.1 to 0.5 mm. Generally, the decorative film 10 may have a deformation coefficient different from that of the supporting frame 20. Thus, a stress may be generated during the injection molding of the supporting frame 20, which may cause birefringence of the decorative film 10 and the supporting frame 20. The compression process in the final step may remove or reduce the stress generated during the injection molding. It should be understood, of course, that only the portion of the supporting frame 20 attached to the display section 12 is compressed in the compression process of the final step. Thus, any potential image aberration caused by the birefringence of the decorative film 10 can be reduced, when the mold 30 is used in the electronic device 200.

It should be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A housing for an electronic device, comprising:
    a decorative film having a surface comprising a decorative section and a display section capable of transmitting light, the decorative section having a decorative coating coated thereon; and
    a supporting frame made of a transparent material and integrally molded onto the decorative film.

2. The housing as claimed in claim 1, wherein the decorative film is made of clear polycarbonate film.

3. The housing as claimed in claim 1, wherein the decorative coating is an ink coating, a paint coating or a metal coating.

4. The housing as claimed in claim 1, wherein the supporting frame is made of a transparent plastic material, advantageously chosen from the group consisting of polycarbonate, polymethyl methacrylate, polystyrene, and any desired combination thereof.

5. The housing as claimed in claim 1, wherein the supporting frame is made of silica gel.

6. The housing as claimed in claim 1, wherein the supporting frame is attached to the decorative coating and the display section of the decorative film using injection molding, with the decorative coating being laid between the decorative film and the supporting frame.

7. An electronic device, comprising:
    a printed circuit board;
    a display unit electrically connected to the printed circuit board;
    a housing for an electronic device, comprising:
    a decorative film having a surface comprising a decorative section and a display section capable of transmitting light, the decorative section having a decorative coating coated thereon; and
    a supporting frame made of a transparent material and integrally molded to the decorative film;
    wherein the printed circuit board and the display unit are received in the housing, the display unit is configured to align with the display section, in manner of that light transmitted from the display unit is capable of transmitting through the display section.

8. The electronic device as claimed in claim 7, wherein the decorative film is made of clear polycarbonate thin film.

9. The electronic device as claimed in claim 7, wherein the decorative coating is an ink coating, a paint coating or a metal coating.

10. The electronic device as claimed in claim 7, wherein the supporting frame is made of a transparent plastic material, advantageously chosen from the group consisting of polycarbonate, polymethyl methacrylate, polystyrene, and any desired combination thereof.

11. The electronic device as claimed in claim 7, wherein the supporting frame is made of silica gel.

12. The electronic device as claimed in claim 7, wherein the supporting frame is attached to the decorative coating and the display section of the decorative film using injection molding, with the decorative coating being laid between the decorative film and the supporting frame.

13. A method for making a housing, comprising steps of:
    providing a decorative film comprising a decorative section and a display section capable of transmitting light, the decorative section having a decorative coating formed thereon, the decorative coating defining the display section;
    proving a mold including a female mold and a male mold, the female mold defining a recessed portion, the male mold having a movable mold core;
    attaching the decorative film into the recessed portion;
    injection molding a supporting frame attached to the decorative film in the mold; and
    moving the mold core toward the recessed portion to compress the supporting frame.

14. The method for making a housing as claimed in claim 13, wherein the decorative film is made of clear polycarbonate thin film.

15. The method for making a housing as claimed in claim 13, wherein the decorative coating is an ink coating, a paint coating or a metal coating.

16. The method for making a housing as claimed in claim 13, wherein the decorative film is attached into the recessed portion of the female mold, with the decorative coating facing the male mold.

17. The method for making a housing as claimed in claim 13, wherein the supporting frame is made of a transparent plastic material, chosen from the group consisting of polycarbonate, polymethyl methacrylate, polystyrene, and any desired combination thereof.

18. The method for making a housing as claimed in claim 13, wherein the supporting frame is made of silica gel.

* * * * *